(12) United States Patent
Chou et al.

(10) Patent No.: US 12,020,994 B2
(45) Date of Patent: Jun. 25, 2024

(54) POWER ALARM AND FIRE LOADING RISK REDUCTION FOR A DEPOSITION TOOL

(71) Applicant: Taiwan Semiconductor Manufacturing Company, Ltd., Hsinchu (TW)

(72) Inventors: Chih-Wei Chou, Zhubei (TW); Yuan-Hsin Chi, Longjing Township (TW); Sheng-Yuan Lin, Hsinchu (TW); Yin-Tun Chou, Hsinchu (TW); Hung-Chih Wang, Zhubei (TW); Yu-Chi Liu, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 572 days.

(21) Appl. No.: 17/303,987

(22) Filed: Jun. 11, 2021

(65) Prior Publication Data
US 2022/0301947 A1 Sep. 22, 2022

Related U.S. Application Data

(60) Provisional application No. 63/200,647, filed on Mar. 19, 2021.

(51) Int. Cl.
*H01L 21/02* (2006.01)
*H01L 21/66* (2006.01)
*H01L 21/67* (2006.01)

(52) U.S. Cl.
CPC ........ *H01L 22/14* (2013.01); *H01L 21/02274* (2013.01); *H01L 21/67253* (2013.01); *H01L 21/67248* (2013.01)

(58) Field of Classification Search
CPC .......................... C23C 14/3407; H01L 22/14
See application file for complete search history.

(56) References Cited

U.S. PATENT DOCUMENTS

2020/0362676 A1\* 11/2020 Goyeneche ............... F42B 3/02

\* cited by examiner

*Primary Examiner* — Jaehwan Oh
(74) *Attorney, Agent, or Firm* — Harrity & Harrity, LLP (57) ABSTRACT

A deposition tool includes a power cable pedestal including a pedestal body with a first surface and a second surface and a guide hole that extends through the pedestal body from the first surface to the second surface, where at least a portion of a sidewall of the guide hole has a slanted surface, and where the pedestal body is formed from a first material with a melting point that is higher than a melting point of Polyoxymethylene (POM). The deposition tool includes a bushing arranged over the guide hole, where the bushing is formed from a second material with a melting point that is higher than the melting point of POM.

20 Claims, 5 Drawing Sheets

POWER ALARM AND FIRE LOADING RISK REDUCTION FOR A DEPOSITION TOOL

CROSS-REFERENCE TO RELATED APPLICATION

This Patent Application claims priority to U.S. Provisional Patent Application No. 63/200,647, filed on Mar. 19, 2021, and entitled "POWER ALARM AND FIRE LOADING RISK REDUCTION FOR A DEPOSITION TOOL." The disclosure of the prior Application is considered part of and is incorporated by reference into this Patent Application.

BACKGROUND

A deposition tool may utilize a physical vapor deposition (PVD) process during a fabrication process for manufacturing integrated circuits and devices. PVD is a plasma process performed in a vacuum chamber where a biased target is exposed to a plasma of an inert gas having relatively heavy atoms (e.g., argon (Ar)) or a gas mixture comprising such an inert gas. Bombardment of the target by ions of the inert gas results in ejection of atoms of the target material. The ejected atoms accumulate as a deposited film on a substrate that is placed below the target in the chamber. One example of a material that can be deposited using PVD is aluminum-copper (AlCu). In some cases, the deposition tool requires high power (e.g., over 10000 watts (W)) in order to perform a deposition process such as PVD.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A deposition tool includes a power cable pedestal for supporting a power cable (e.g., a direct current (DC) power cable) that provides power in association with biasing a target of the deposition tool in association with performing a PVD process. The power cable pedestal and a bushing arranged over the power cable pedestal (e.g., associated with guiding a pin screw through the power cable pedestal) are typically formed from a thermoplastic material with a relatively low melting point (e.g., approximately 165 degrees Celsius (° C.)), such as Polyoxymethylene (POM).

However, under the high power conditions present during operation of the deposition tool when performing the PVD process, the thermoplastic power cable pedestal and bushing are susceptible to melting. The melting of the power cable pedestal and/or the bushing can cause a short between a fire wire and a ground, which triggers a power alarm or causes a fire loading risk, which can decrease availability of the deposition tool, increase wafer scrapping, trigger a need for preventive maintenance, or trigger a need to replace the power cable and/or one or more other related components of the deposition tool.

Some implementations described herein provide techniques and apparatuses for reducing a power alarm and fire loading risk in a deposition tool. In some implementations, the deposition tool includes a power cable pedestal and/or a bushing formed from a material with a relatively high melting point (e.g., a melting point higher than 165° C.), such as a ceramic material, a Polyaryletherketone (PAEK) material, or another type of material with a melting point that is higher than that of POM. In some implementations, the use of such a material increases a melting point of the power cable pedestal and the bushing, which prevents melting of the power cable pedestal and the bushing, and thereby reduces a likelihood that a power alarm or a fire loading risk is triggered (e.g., by preventing a short between a fire wire and a ground). As a result, availability of the deposition tool is increased, wafer scrapping is decreased, a frequency of preventive maintenance is reduced, and/or frequency of a need to replace the power cable and/or one or more other related components of the deposition tool is reduced. Further, because melting of the power cable pedestal and the bushing is prevented, a cost of replacing the power cable pedestal and the bushing is eliminated, as well as a cost incurred for cleaning other components of the deposition tool required after the power cable pedestal or the bushing is melted. Notably, no additional components need to be added to the deposition tool in order to provide this power alarm and fire loading risk reduction described herein.

In some implementations, the power cable pedestal includes a guide hole associated with guiding a pin screw, where the guide hole extends through a pedestal body (e.g., from a lower surface to an upper surface). In some implementations, a portion of a sidewall of the guide hole at the lower surface has a slanted surface, and a width of the guide hole at the lower surface of the pedestal body is configured to prevent the pedestal body from striking a pin screw contact on a chamber of the deposition tool, thereby preventing cracking of the power cable pedestal. Additional details are provided below.

Figure 1A:
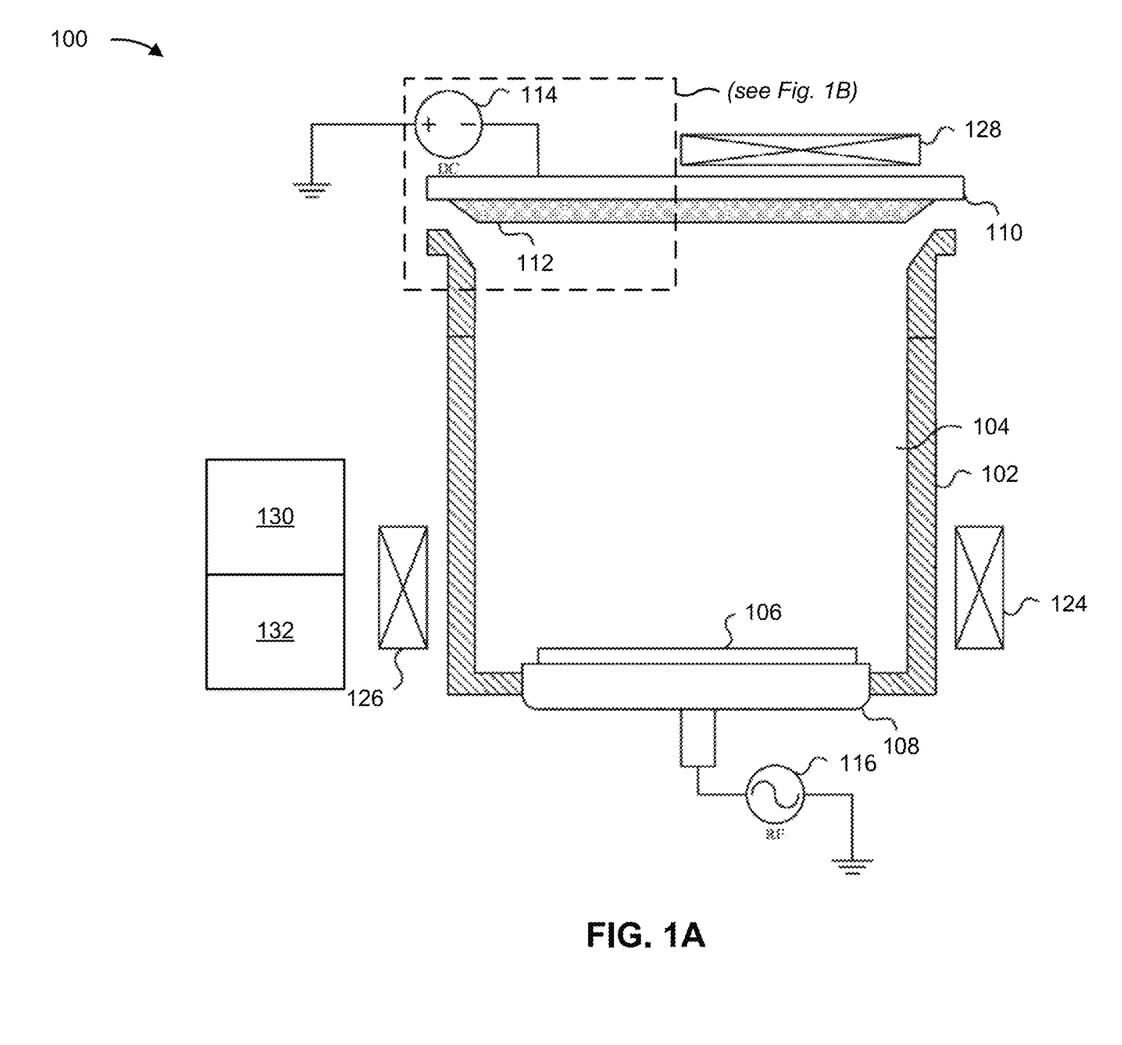
FIGS. 1A and 1B is a diagram of an example semiconductor processing tool described herein.
Figure 1B:
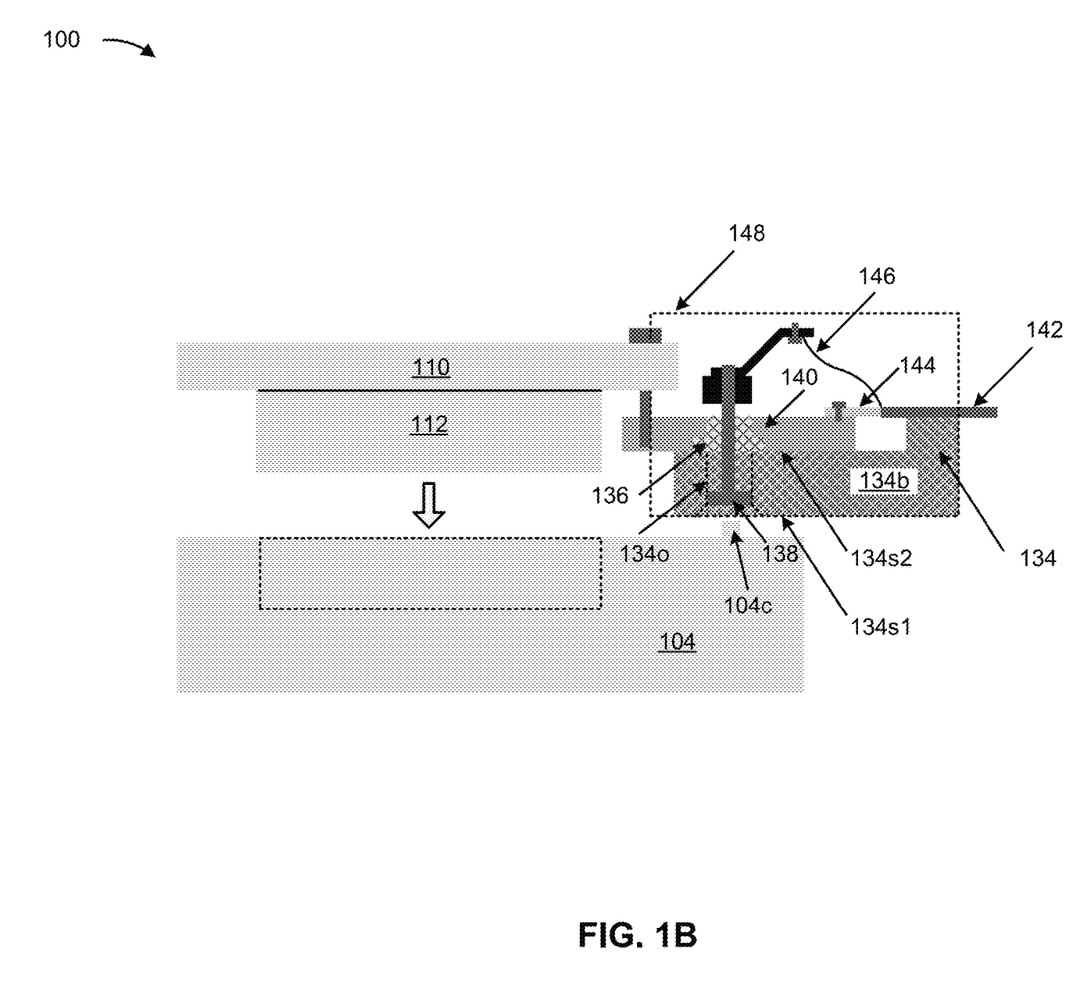

FIGS. 1A and 1B are diagrams illustrating a semiconductor processing tool 100 described herein. The example semiconductor processing tool 100 includes an example of a deposition tool (e.g., a semiconductor processing tool configured to perform a PVD process). FIG. 1A is a diagram illustrating a cross-section of the semiconductor processing tool 100, while FIG. 1B is a diagram illustrating components associated with applying power to a target of the semiconductor processing tool 100.

As shown in FIG. 1A, the semiconductor processing tool 100 includes a containment shield 102 that forms a chamber 104. A wafer 106 is supported and brought into position in the chamber 104 by a wafer pedestal 108. In some implementations, the wafer pedestal 108 is an electrostatic chuck, or e-chuck. In some implementations, one or more clamps (not shown) may be positioned over the edges of the wafer 106 to help secure the wafer 106 in place on the wafer pedestal 108. In some implementations, the wafer pedestal 108 has a temperature control and maintenance system that allows a temperature of the wafer 106 to be controlled. For example, the wafer pedestal 108 may be used to cool the wafer 106 as the chamber 104 may be heated for and by the production of a plasma therein. Regulating the temperature of the wafer 106 may improve characteristics of the deposited material layer and increase the deposition rate by promoting condensation.

As further shown in FIG. 1A, opposite the wafer 106 and the wafer pedestal 108 (above the chamber 104) there is a target carrier structure 110 that supports a target 112. The target carrier structure 110 secures the target 112 during operation of the semiconductor processing tool 100. The target 112 is a piece of material from which the material layer on the wafer 106 is to be formed. The target 112 may be, for example, a conductive material (e.g., a copper), an insulating material, or a precursor material that reacts with a gas to form a molecule from which the deposited material layer is made.

As further shown in FIG. 1A, a number of power supplies are provided in the semiconductor processing tool 100 in association with generating and controlling the plasma within the chamber 104 and directing sputtering, etching, or resputtering, as performed by the semiconductor processing tool 100. As shown, a direct current (DC) power supply 114 is coupled to the target carrier structure 110 to supply DC power to the target carrier structure 110. As further shown, a radio frequency alternating current (RF) power supply 116 is coupled to the wafer pedestal 108. In some implementations, an RF power supply is also provided to the target carrier structure 110 in addition to the DC power supply 114.

As further illustrated in FIG. 1A, the semiconductor processing tool 100 in some implementations includes a number of magnets. For example, the semiconductor processing tool 100 may include lateral magnet 124 and lateral magnet 126. The lateral magnets 124 and 126 are positioned within the semiconductor processing tool 100 outside the containment shield 102 and may be coil magnets. Additionally, a magnetron 128 is in some implementations provided over the target carrier structure 110. The magnetron 128 provides a magnetic field to the chamber 104, particularly an upper portion of the chamber 104, that can facilitate the control and use of the plasma.

In operation, the semiconductor processing tool 100 can be used for sputtering deposition and for resputtering or etching. For example, the power supply 114 may supply power to the target 112 to bias the target 112. As shown, the target 112 is positioned in the chamber 104 and exposed to a plasma of an inert gas (e.g., argon (Ar)) or a gas mixture comprising an inert gas. Bombardment of the target 112 by ions of the inert gas results in ejection of atoms of material of the target 112. The ejected atoms accumulate as a deposited film on the wafer 106 below the target 112 in the chamber 104. One example of a material that can be deposited using PVD is aluminum-copper (AlCu). In some cases, the semiconductor processing tool 100 requires high power (e.g., over 10000 watts (W)) in order to perform a deposition process such as PVD.

In some implementations, the power provided by the DC power supply 114 and/or by the RF power supply 116 is controlled by a control system 130, which may include one or more processors in communication with memory. The memory may include process recipes that are preprogrammed for use in device fabrication. The memory may include instructions that describe and implement the recipes. In some implementations, the processors are communicatively coupled to the DC power supply 114 and the RF power supply 116 and to a set of sensors in the semiconductor processing tool 100. The set of sensors may include, for example, temperature sensors, pressure sensors, position sensors, field sensors, or one or more other types of sensor that can provide information based on which operation of the semiconductor processing tool 100 can be based.

In some implementations, the semiconductor processing tool 100 includes a gas and pressure system 132. In some implementations, the gas and pressure system 132 includes valves, conduits, pressure sensors, or flow sensors to be used in association with, for example, controlling pressure within the chamber 104, introducing reactant gases to the chamber 104, or removing exhaust gases from the chamber 104. In some implementations, the gas and pressure system 132 is in communication with the control system 130.

FIG. 1B is a diagram illustrating components associated with applying power to the target 112 using the DC power supply 114 of the semiconductor processing tool 100, as described above. As shown in FIG. 1B, the semiconductor processing tool 100 further includes a power cable pedestal 134, a bushing 136, a pin screw 138, a conductor 140, a power cable 142, a fire wire 144, a ground 146, and a lid 148.

The power cable pedestal 134, the bushing 136, the pin screw 138, the conductor 140, the power cable 142, the fire wire 144, and the ground 146 are components that enable the above-described operation of the semiconductor processing tool 100. For example, as shown in FIG. 1B, the power cable pedestal 134 supports the power cable 142 such that the power cable 142 can provide power in association with biasing the target 112. The bushing 136 is arranged in an opening of the conductor 140 and over a guide hole 134*o* in a pedestal body 134*b* of the power cable pedestal 134 in order to support the pin screw 138 (e.g., such that the pin screw 138 can contact a pin screw contact 104*c* on the chamber 104). The conductor 140 enables power from the power cable 142 to provide power to the target 112 in association with biasing the target 112. The fire wire 144 is a component configured to enable detection of a high power event in association with triggering a power alarm for the semiconductor processing tool 100. The ground 146 provides a ground contact for the semiconductor processing tool 100. The lid 148 contains one or more components of the semiconductor processing tool 100, as illustrated in FIG. 1B.

As shown, in some implementations, the power cable pedestal 134 includes a pedestal body 134*b* with a first surface 134*s*1 (e.g., an upper surface of the pedestal body 134*b*) and a second surface 134*s*2 (e.g., a lower surface of the pedestal body 134*b*). As further shown, the pedestal body 134*b* further includes a guide hole 134*o* that extends through the pedestal body 134*b* from the first surface 134*s*1 to the second surface 134*s*2. As shown, the guide hole 134*o* guides the pin screw 138 such that a bottom surface of the pin screw 138 can contact a pin screw contact 104*c* on the chamber 104 (e.g., a protrusion on a surface of the chamber 104). In some implementations, the guide hole 134*o* is configured to prevent the pedestal body 134*b* from striking the pin screw contact 104*c* on the chamber 104 when the lid 148 moves from a closed position (e.g., a position at which the target 112 is in the chamber 104) to an open position (e.g., a position at which the target 112 is outside of the chamber 104). Additional details regarding the guide hole 134*o* are described below with respect to FIGS. 2A-2C.

In some implementations, the power cable pedestal 134 is formed from a material with a melting point that is higher than a melting point of Polyoxymethylene (POM) (e.g., a melting point higher than approximately 165° C.). For example, in some implementations, the power cable pedestal 134 is formed from a ceramic material (e.g., a ceramic material with a melting point of approximately 2054 ° C.), a Polyaryletherketone (PAEK) material (e.g., Polyether ether ketone (PEEK)), or another type of material with a melting point that is higher than the melting point of POM.

In some implementations, the bushing 136 is formed from a material with a melting point that is higher than the melting point of POM (e.g., a melting point higher than approximately 165° C.). For example, in some implementations, the bushing 136 is formed from a ceramic material, a PAEK material (e.g., PEEK), or another type of material with a melting point that is higher than the melting point of POM. In some implementations, the bushing 136 is formed from the same type of material as that of the power cable pedestal 134. Alternatively, the power cable pedestal 134 and the bushing 136 can be formed from different types of material.

In some implementations, the material used for the power cable pedestal 134 or the bushing 136 has a high short-duration maximum use temperature (e.g., a short-duration maximum use temperature that is greater than that of POM or another similar material; a short-duration maximum use temperature greater than 95° C., such as approximately 1600° C., or the like). In some implementations, the material used for the power cable pedestal 134 or the bushing 136 has a high long-duration maximum use temperature (e.g., a long-duration maximum use temperature that is greater than that of POM or another similar material; a long-duration maximum use temperature greater than 76° C., such as approximately 1280° C., or the like).

Notably, the use of materials with relatively high melting points for the power cable pedestal 134 and the bushing 136 increases a melting point of the power cable pedestal 134 and the bushing 136, which prevents melting of the power cable pedestal 134 and the bushing 136, and thereby reduces a likelihood that a power alarm or a fire loading risk is triggered (e.g., by preventing a short between the fire wire 144 and the ground 146). As a result, availability of the semiconductor processing tool 100 is increased, wafer scrapping is decreased, a frequency of preventive maintenance is reduced, and/or frequency of a need to replace the power cable 142 and/or one or more other related components of the semiconductor processing tool 100 is reduced. Further, because melting of the power cable pedestal 134 and the bushing 136 is prevented, a cost of replacing the power cable pedestal 134 and the bushing 136 is eliminated, as well as a cost incurred for cleaning other components of the semiconductor processing tool 100 required after the power cable pedestal 134 or the bushing 136 is melted.

As indicated above, FIGS. 1A and 1B are provided as an example. Other examples may differ from what is described with regard to FIGS. 1A and 1B. The number and arrangement of devices shown in FIGS. 1A and 1B are provided as an example. In practice, there may be additional devices, fewer devices, different devices, or differently arranged devices than those shown in FIGS. 1A and 1B. Furthermore, two or more devices shown in FIGS. 1A and 1B may be implemented within a single device, or a single device shown in FIGS. 1A and 1B may be implemented as multiple, distributed devices. Additionally, or alternatively, a set of devices (e.g., one or more devices) shown in FIGS. 1A and 1B may perform one or more functions described as being performed by another set of devices shown in FIGS. 1A and 1B.

Figure 2A:
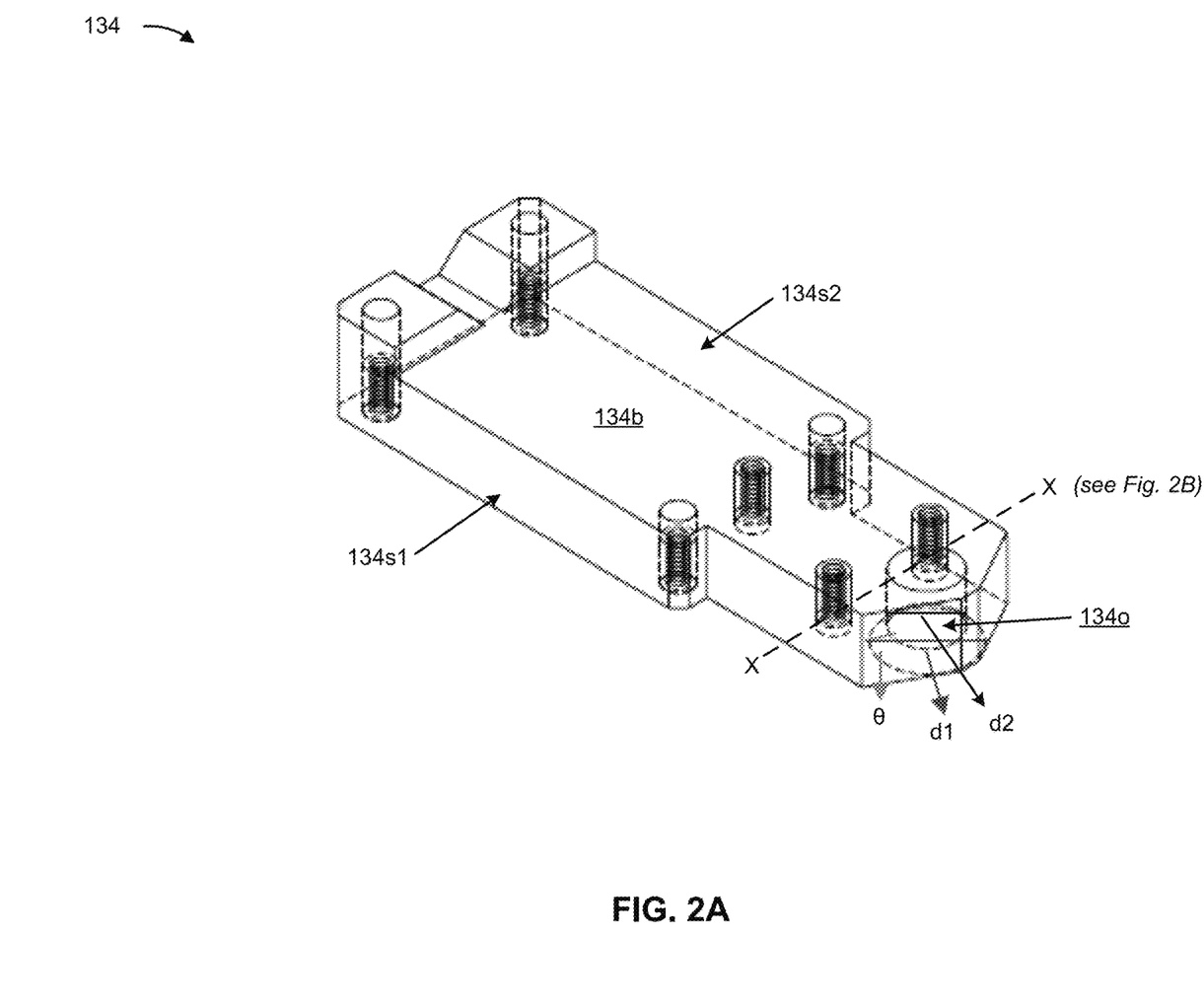
FIGS. 2A-2C are diagrams of an example implementation described herein.
Figure 2B:
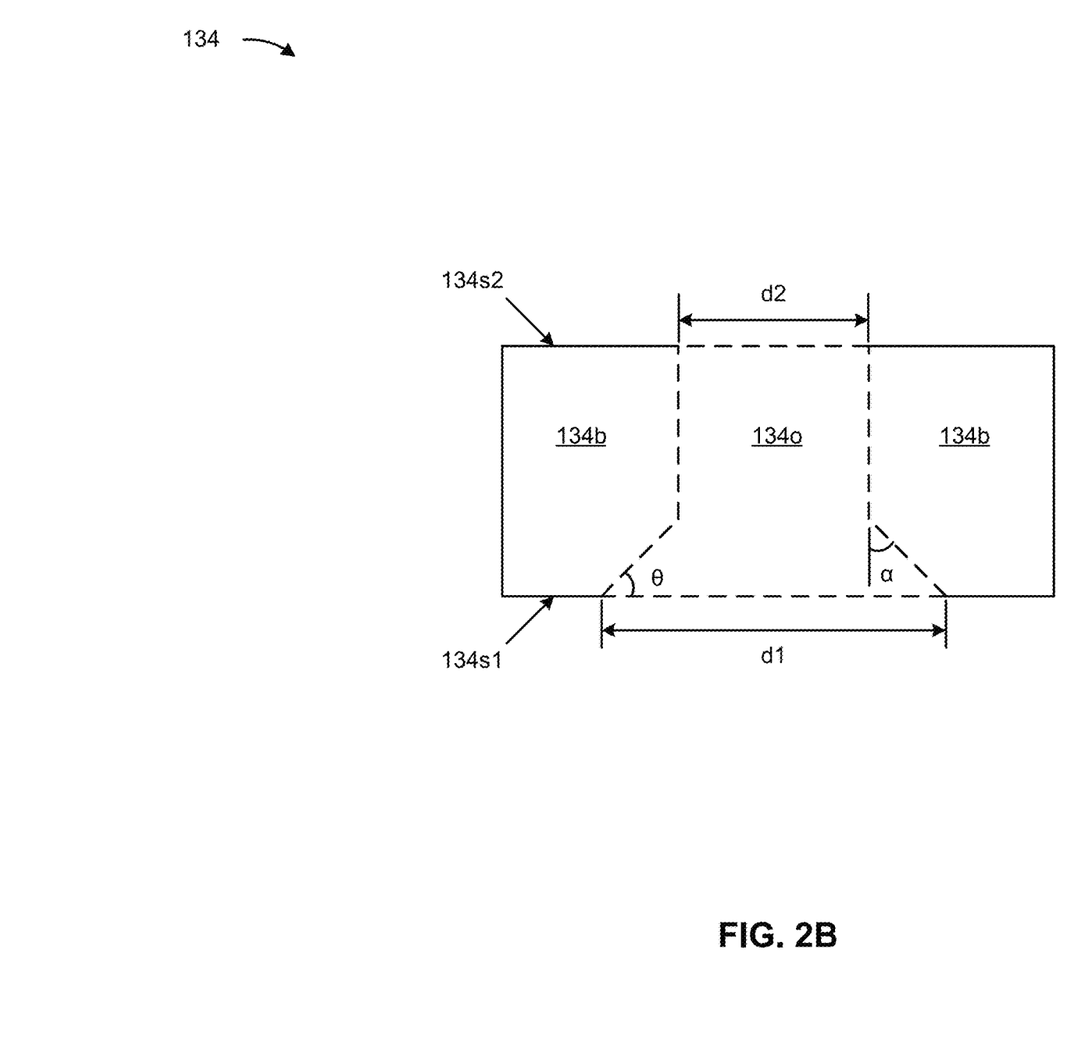
Figure 2C:
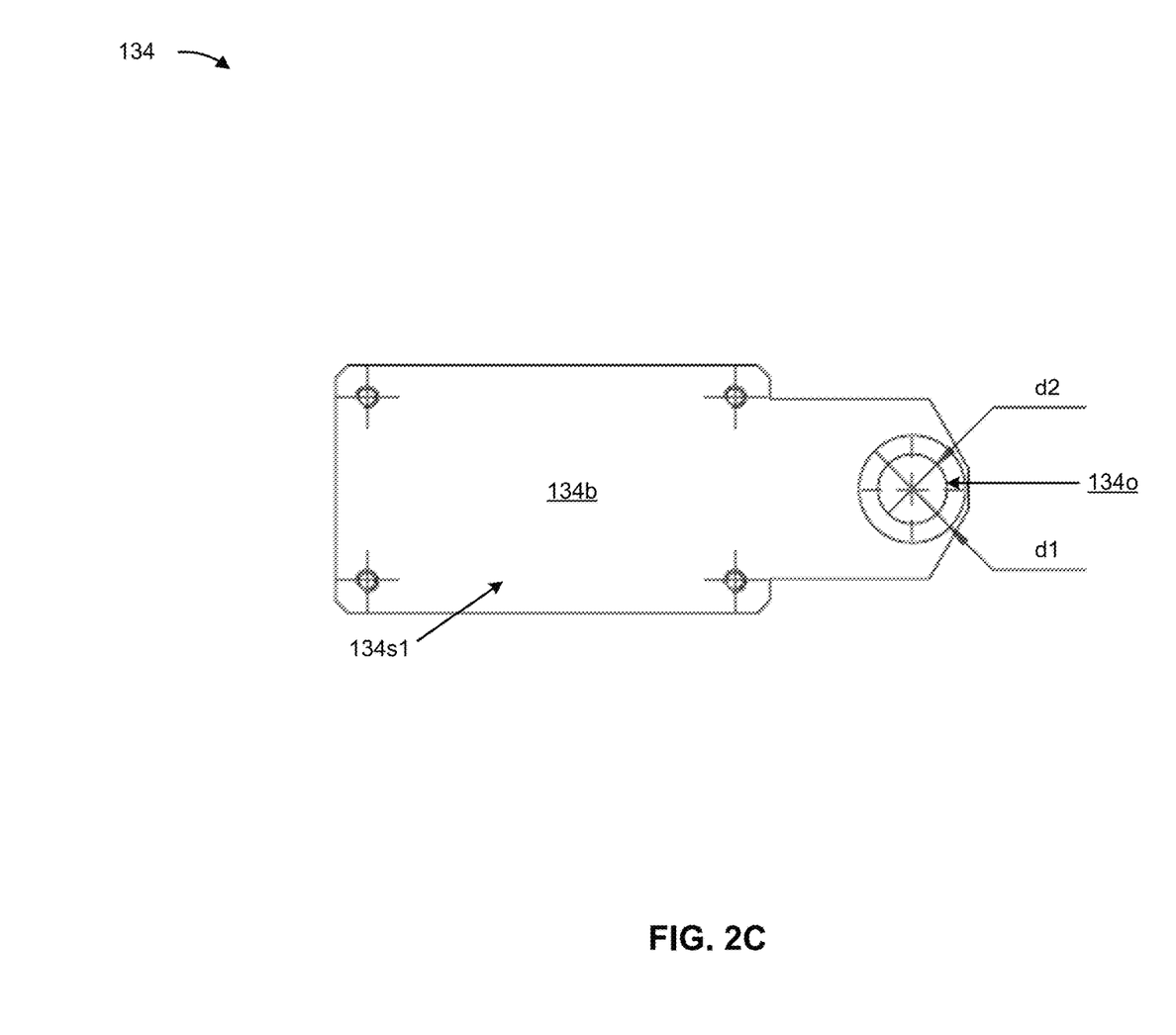

FIGS. 2A-2C are diagrams of an example implementation of the power cable pedestal 134 described herein. FIGS. 2A-2C illustrate various views of the power cable pedestal 134 for the purpose of illustrating characteristics of a guide hole 134*o* that extends through the power cable pedestal 134. As illustrated in FIGS. 2A-2C, in some implementations, at least a portion of a sidewall of the guide hole 134*o* has a slanted surface. That is, the portion of the sidewall of the guide hole 134*o* is non-perpendicular to the first surface 134*s*1 and the second surface 134*s*2. Additionally, the portion of the sidewall of the guide hole 134*o* is non-parallel to another portion of the sidewall of the guide hole 134*o* (e.g., a sidewall of a lower portion of the guide hole 134*o* is non-parallel to a sidewall of an upper portion of the guide hole 134*o*). In some implementations, as illustrated in FIGS. 2A and 2B, an angle θ between the first surface 134*s*1 and the portion of the sidewall of the guide hole 134*o* having the slanted surface is less than approximately 90 degrees)(°). For example, the angle θ between the first surface 134*s*1 and the portion of the sidewall of the guide hole 134*o* having the slanted surface can be approximately 45°. However, other values for the angle θ are within the scope of the present disclosure.

In some implementations, as illustrated in FIG. 2B, an angle α between an upper portion of the sidewall of the guide hole 134*o* and the portion of the sidewall of the guide hole 134*o* having the slanted surface (i.e., the lower portion of the sidewall of the guide hole 134*o*) is less than approximately 90°. For example, the angle α between the upper portion of the sidewall of the guide hole 134*o* and the lower portion of the sidewall of the guide hole 134*o* having the slanted surface can be approximately 45°. However, other values for the angle α are within the scope of the present disclosure. In some implementations, a height of the upper portion of the sidewall of the guide hole 134*o* is in a range from approximately 0.1 mm to approximately 12.5 mm, such as 11 mm. In some implementations, a height of the lower portion of the sidewall of the guide hole 134*o* is in a range from approximately 0.1 mm to approximately 12.5 mm, such as 3 mm. Thus, in some implementations, a height of the guide hole 134*o* (i.e., a thickness of the pedestal body 134*b*) is in a range from approximately 3.5 mm to approximately 14 mm, such as 12 mm.

In some implementations, the slanted portion of the sidewall of the guide hole 134*o* means that a width d1 of the guide hole 134*o* at the first surface 134*s*1 is greater than a width d2 of the guide hole 134*o* at the second surface 134*s*2. In some implementations, the width d2 is in a range from approximately 9.5 millimeters (mm) to approximately 15.0 mm, such as 11.0 mm. However, other values for the width d2 are within the scope of the present disclosure. In some implementations, the width d2 is sized to permit the pin screw 138 to pass through the guide hole 134o. That is, in some implementations, the width d2 is selected so as to enable the pin screw 138 to fit through the guide hole 134o. In some implementations, the width d1 is greater than the width d2 (e.g., due to the portion of the sidewall having a slanted surface). In some implementations, the width d1 is in a range from approximately 15.5 mm to approximately 21.0 mm, such as 17.0 mm. However, other values for the width d1 are within the scope of the present disclosure. In a particular example, the angle θ is approximately 45°, the width d2 is 11.0 mm, and the width d1 is 17.0 mm.

As further shown in FIGS. 2A-2C, the width of the portion of the guide hole 134o with the slanted surface decreases in a direction from the first surface 134s1 toward the second surface 134s2. That is, the portion of the guide hole 134o with the slanted surface decreases in size in a direction moving from the first surface 134s1 to the second surface 134s2. In some implementations, the width of the portion of the guide hole 134o with the slanted surface decreases so that, at an interface between the portion of the guide hole 134o with the slanted surface (i.e., the lower portion of the guide hole 134o) and the upper portion of the guide hole 134o, the width of the lower portion of the guide hole 134o matches the width of the upper portion of the guide hole 134o. In some implementations, the sidewall of the upper portion of the guide hole 134o is perpendicular to the second surface 134s2 (rather than being slanted) in order to enable the pin screw 138 to pass through the guide hole 134o and to enable the pedestal 134 to meet size constraint for usability in the semiconductor processing tool 100 (e.g., since a guide hole 134o with an entirely slanted surface could require width d1 that is larger than the allowable dimensions of the pedestal body 134b).

In some implementations, the guide hole 134o of the pedestal body 134b is formed having a sidewall portion with a slanted surface in order to prevent the pedestal body 134b from striking the pin screw contact 104c on the chamber 104 when the lid 148 moves from a closed position (e.g., a position at which the target 112 is in the chamber 104) to an open position (e.g., a position at which the target 112 is outside of the chamber 104). That is, the guide hole 134o of the pedestal body 134b is formed so that, as the lid 148 opens or closes, the pedestal body 134b does not strike or otherwise contact the pin screw contact 104c on the chamber 104. Here, the slanted portion of the sidewall of the guide hole 134o in the pedestal body 134b has the width d1 at the first surface 134s1, which prevents a corner or edge of the guide hole 134o at the first surface 134s1 from striking or otherwise contacting the pin screw contact 104c as the lid 148 is opened or closed. Notably, a pedestal body without a slanted surface (e.g., a pedestal body with a guide hole with a comparatively narrower opening at the first surface of the pedestal body) could strike or otherwise contact the pin screw contact 104c as the lid 148 is opened or closed. In this way, cracking or other contact-related damage to the pedestal body 134b during opening or closing of the lid 148 is prevented.

In some implementations, the power cable pedestal 134 may include one or more other features. For example, as shown in FIGS. 2A and 2C, the pedestal body 134b of the power cable pedestal 134 may include one or more other openings or recesses sized to accept a fastener (e.g., a screw) associated with affixing the power cable pedestal 134 to one or more other components of the semiconductor processing tool 100 or sized to accept a conductor through which DC power is to be provided in association with performing a deposition process. Notably, the examples of these other features shown in FIGS. 2A and 2C are provided as examples, and other configurations or arrangements of such features are possible depending on a design of the semiconductor processing tool 100.

As indicated above, FIGS. 2A-2C are provided as examples. Other examples may differ from what is described with regard to FIGS. 2A-2C.

As described above, use of the material with the relatively high melting point for forming the power cable pedestal 134 and the bushing 136 prevents melting of the power cable pedestal 134 and the bushing 136, thereby reducing a likelihood that a power alarm or a fire loading risk is triggered (e.g., by preventing a short between the fire wire 116 and the ground 118). As a result, availability of the semiconductor processing tool 100 is increased, wafer scrapping is decreased, a frequency of preventive maintenance is reduced, and/or frequency of a need to replace the power cable 114 and/or one or more other related components of the semiconductor processing tool 100 is reduced. Further, because melting of the power cable pedestal 134 and the bushing 136 is prevented, a cost of replacing the power cable pedestal 134 and the bushing 136 is eliminated, as well as a cost incurred for cleaning other components of the semiconductor processing tool 100 required after the power cable pedestal 134 or the bushing 136 is melted. Notably, no additional components need to be added to the semiconductor processing tool 100 in order to provide this power alarm and fire loading risk reduction described herein. Further, as described herein, the power cable pedestal 134 includes a guide hole 134o that extends through the pedestal body 134b (e.g., from the first surface 134s1 to the second surface 134s2), where a portion of a sidewall of the guide hole 134o at the first surface 134s1 has a slanted surface, and a width of the guide hole 134o at the first surface 134s1 of the pedestal body 134b is configured to prevent the pedestal body 134b from striking the pin screw contact 104c on the chamber 104 of the semiconductor processing tool 100, thereby preventing cracking of the power cable pedestal 134.

As described in greater detail above, some implementations described herein provide a deposition tool. The deposition tool includes a power cable pedestal including, a pedestal body with a first surface and a second surface, and a guide hole that extends through the pedestal body from the first surface to the second surface, where at least a portion of a sidewall of the guide hole has a slanted surface, and where the pedestal body is formed from a first material with a melting point that is higher than a melting point of POM. The deposition tool includes a bushing arranged over the guide hole, where the bushing is formed from a second material with a melting point that is higher than the melting point of POM.

As described in greater detail above, some implementations described herein provide a semiconductor processing tool. The semiconductor processing tool includes a pedestal including a pedestal body with a first surface and a second surface, and a guide hole that extends from the first surface to the second surface and includes a first portion and a second portion, where a width of the first portion of the guide hole at the first surface is greater than a width of the second portion of the guide hole, and where the pedestal body is formed from a ceramic material or a PAEK material.

As described in greater detail above, some implementations described herein provide an apparatus. The an apparatus includes a pedestal including a pedestal body, where the pedestal body is formed from a material with a melting point that is higher than a melting point of POM, and a guide hole that extends through the pedestal body from a first surface of the pedestal body to a second surface of the pedestal body, where a width of the guide hole at the first surface of the pedestal body is configured to prevent the pedestal body from coming into contact with a protrusion on a surface over which the guide hole is to be placed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A deposition tool, comprising:
a power cable pedestal including:
 a pedestal body with a first surface and a second surface, and
 a guide hole that extends through the pedestal body from the first surface to the second surface,
  wherein at least a portion of a sidewall of the guide hole has a slanted surface, and
  wherein the pedestal body is formed from a first material with a melting point that is higher than a melting point of Polyoxymethylene (POM); and
a bushing arranged over the guide hole,
 wherein the bushing is formed from a second material with a melting point that is higher than the melting point of POM.

2. The deposition tool of claim 1, wherein a width of the guide hole at the first surface is greater than a width of the guide hole at the second surface.

3. The deposition tool of claim 1, wherein a width of a portion of the guide hole decreases in a direction from the first surface toward the second surface.

4. The deposition tool of claim 1, wherein at least a portion of the sidewall of the guide hole is not perpendicular to the first surface or the second surface.

5. The deposition tool of claim 1, wherein the guide hole includes a first portion with a first sidewall surface and a second portion with a second sidewall surface, and an angle between the second sidewall surface and the first sidewall surface is less than 90 degrees.

6. The deposition tool of claim 1, wherein a width of the guide hole at the first surface of the pedestal body is configured to prevent the pedestal body from striking a pin screw contact on a chamber of the deposition tool.

7. The deposition tool of claim 1, wherein at least one of the first material or the second material is a ceramic material.

8. The deposition tool of claim 1, wherein at least one of the first material or the second material is a Polyaryletherketone material.

9. A semiconductor processing tool, comprising:
a pedestal including:
 a pedestal body with a first surface and a second surface; and
 a guide hole that extends from the first surface to the second surface and includes a first portion and a second portion,
  wherein a width of the first portion of the guide hole at the first surface is greater than a width of the second portion of the guide hole, and
  wherein the pedestal body is formed from a ceramic material or a Polyaryletherketone (PAEK) material.

10. The semiconductor processing tool of claim 9, further comprising a bushing over the guide hole, the bushing being formed from a ceramic material or a PAEK material.

11. The semiconductor processing tool of claim 9, wherein a sidewall of the first portion of the guide hole is non-perpendicular to the first surface.

12. The semiconductor processing tool of claim 9, wherein a sidewall of the first portion of the guide hole is non-parallel to a sidewall of the second portion of the guide hole.

13. The semiconductor processing tool of claim 9, wherein a width of the first portion of the guide hole increases in a direction from the second surface toward the first surface.

14. The semiconductor processing tool of claim 9, wherein the first portion of the guide hole is sized to prevent the pedestal body from contacting a protrusion on a surface of the semiconductor processing tool.

15. The semiconductor processing tool of claim 9, wherein the pedestal body is formed from a ceramic material or from a Polyaryletherketone material.

16. An apparatus, comprising:
a pedestal, including:
 a pedestal body,
  wherein the pedestal body is formed from a material with a melting point that is higher than a melting point of Polyoxymethylene (POM); and
 a guide hole that extends through the pedestal body from a first surface of the pedestal body to a second surface of the pedestal body,
  wherein a width of the guide hole at the first surface of the pedestal body is configured to prevent the pedestal body from coming into contact with a protrusion on a surface over which the guide hole is to be placed.

17. The apparatus of claim 16, further comprising a bushing over the guide hole, the bushing being formed from a material with a melting point that is higher than a melting point of POM.

18. The apparatus of claim 16, wherein the width of the guide hole at the first surface is greater than a width of the guide hole at the second surface.

19. The apparatus of claim 16, wherein a width of a portion of the guide hole increases in a direction from the second surface toward the first surface.

20. The apparatus of claim 16, wherein the pedestal body is formed from a ceramic material or from a Polyaryletherketone material.

* * * * *